United States Patent
Gore et al.

(10) Patent No.: US 7,935,471 B2
(45) Date of Patent: May 3, 2011

(54) NIR/IR CURABLE COATINGS FOR LIGHT DIRECTED IMAGING

(75) Inventors: Makarand P. Gore, Ft. Collins, CO (US); Vladek Kasperchik, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1207 days.

(21) Appl. No.: 11/254,273

(22) Filed: Oct. 20, 2005

(65) Prior Publication Data

US 2007/0092828 A1 Apr. 26, 2007

(51) Int. Cl.
G03F 7/00 (2006.01)
G03F 7/004 (2006.01)
G03F 7/032 (2006.01)

(52) U.S. Cl. .................. 430/270.1; 430/905; 430/913; 430/138

(58) Field of Classification Search ............ 430/270.1, 430/138, 905, 713
See application file for complete search history.

(56) References Cited

U.S. PATENT DOCUMENTS

| | | | |
|---|---|---|---|
| 4,842,980 A | 6/1989 | Gottschalk et al. | |
| 5,385,807 A | 1/1995 | Okamoto et al. | |
| 5,387,682 A | 2/1995 | Bonham et al. | |
| 5,466,557 A | 11/1995 | Haley et al. | |
| 6,329,120 B1 * | 12/2001 | Obayashi et al. | 430/270.1 |
| 6,838,222 B2 | 1/2005 | Aoshima et al. | |
| 6,867,282 B2 * | 3/2005 | Nishikubo et al. | 528/408 |
| 2002/0160295 A1 | 10/2002 | Aoshima et al. | |
| 2003/0008239 A1 | 1/2003 | Fujimaki et al. | |
| 2004/0147399 A1 | 7/2004 | Gore | |
| 2005/0053860 A1 | 3/2005 | Gore | |
| 2005/0053863 A1 | 3/2005 | Gore | |
| 2005/0075248 A1 | 4/2005 | Gore et al. | |
| 2006/0275693 A9 * | 12/2006 | Kasperchik et al. | 430/270.1 |

OTHER PUBLICATIONS

International Search Report for International Application No. PCT/US2006/041050. Report issued Apr. 13, 2007.

* cited by examiner

*Primary Examiner* — Amanda C. Walke

(57) ABSTRACT

An imaging medium comprises a substrate and an imaging composition disposed on the substrate. The imaging composition comprises a matrix, a thermochromic compound dispersed or dissolved in the matrix; and at least two photoinitiators dispersed or dissolved in the matrix.

13 Claims, 1 Drawing Sheet

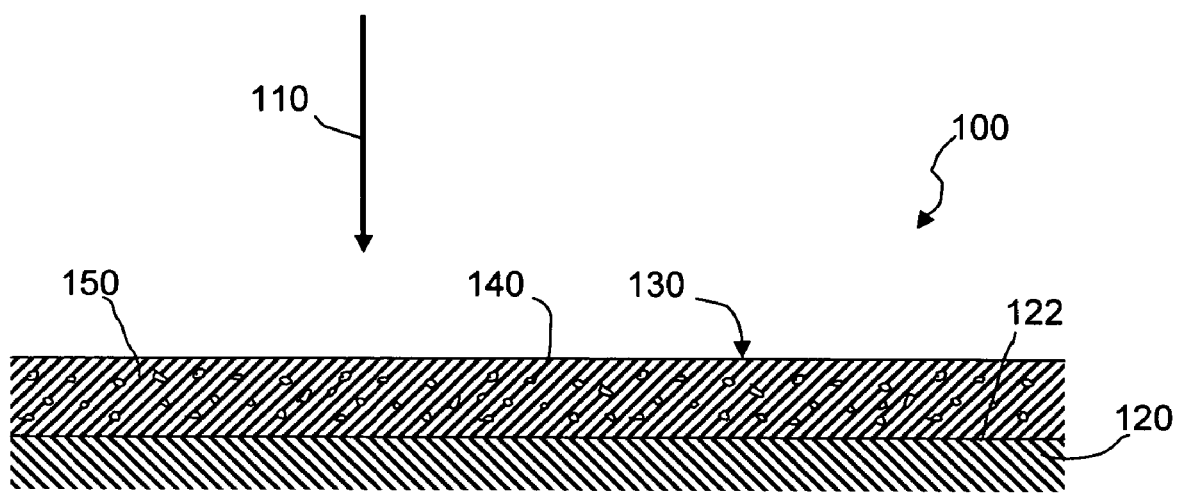

NIR/IR CURABLE COATINGS FOR LIGHT DIRECTED IMAGING

In order to create coatings that can produce human-readable images using the same laser technology that is used to create the machine-readable features, color-forming agents have been added to coating materials. Materials that produce a color change upon stimulation with energy such as light or heat are particularly well-suited to this use. Many of these materials absorb UV light. Because the polymeric coating materials are typically cured with UV light, the presence of UV-absorbing color-forming agents in the uncured coating material can interfere with the curing process, resulting in coatings that are only partially cured. Similarly, other color-forming agents are destroyed or diminished by UV light, so that they cannot be used in conjunction with UV-cured coatings. Hence, it is desirable to provide a durable coating composition that can be cured using wavelengths outside the UV range.

In addition, it has been found that increasing the archival life of a given imaging medium typically entails increasing the curing period. Increased curing periods are undesirable, however, as they increase the time required in manufacturing and also result in slower speed and lower contrast during the marking process. Therefore it is also desirable to provide an imaging medium that provides a cure step during or after marking, resulting in optimal archival stability without requiring increased processing time.

BRIEF SUMMARY

The invention relates to an imaging medium comprising a substrate and an imaging composition disposed on the substrate. The imaging composition comprises a matrix, a thermochromic compound dispersed or dissolved in the matrix; and at least two photoinitiators dispersed or dissolved in the matrix.

BRIEF DESCRIPTION OF THE DRAWINGS

For a detailed description of exemplary embodiments of the invention, reference will now be made to the accompanying drawing, which is a schematic cross-section showing an imaging medium according to embodiments of the present invention on a substrate.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ."

As used herein, the term "visible" in the context of light refers to light (electromagnetic energy) having wavelengths in the range of 400-700 nm.

As used herein, the term "IR" refers to light having wavelengths in the range of 700-10,000 nm.

As used herein, the term "NIR" refers to light having wavelengths in the range of 700-1100 nm.

As used herein, the term "Vis/NIR/IR" refers to light having wavelengths in the range of 400-10,000 nm.

The term "leuco dye" is used herein to refer to a color-forming substance that is colorless or colored in a non-activated state and produces or changes color in an activated state. As used herein, the terms "activator" or "developer" refer to substances that react with the dye and cause the dye to alter its chemical structure and change or acquire color.

The term "antenna" as used herein refers to a light-absorbing compound that is selected for its ability to absorb at a predetermined wavelength or in a predetermined wavelength range. The antenna readily absorbs a desired wavelength of radiation, and transfers energy to cause or facilitate marking. The term "light" as used herein includes electromagnetic radiation of any wavelength or band and from any source.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad applications, and the discussion of any embodiment is meant only to be exemplary of that embodiment, and not intended to intimate that the scope of the disclosure, including the claims, is limited to that embodiment.

Referring briefly to the drawing, there is shown an imaging medium 100 and energy beam 110. Imaging medium 100 may comprise substrate 120 and marking layer 130 on a surface 122 thereof. Substrate 120 may be any substrate upon which it is desirable to make a mark, such as, by way of example only, paper (e.g., labels, tickets, receipts, or stationary), overhead transparencies, or the labeling surface of a medium such as a CD-R/RW/ROM or DVD±R/RW/ROM. Imaging composition 130 may be applied to the substrate via any acceptable method, such as, by way of example only, rolling, spin-coating, spraying, or screen printing.

Color Forming Compositions

In order to allow marking layer 130 to produce a human-visible mark in response to the stimulus (heat), it includes a color-forming composition, which may comprise a color-former and a developer mixture. Any thermochromic color-forming agent may be used in conjunction with the imagable coatings of the present invention. By way of example only, a thermochromic color-forming agent may be present in marking layer 130 and may comprise a single-component heat-responsive dye or a leuco dye in combination with an activator. For example, the color-forming agent may be an irreversible thermochromic material such as an ink or dye. In these embodiments, marking layer 130 may be free of particles and the thermochromic may be dispersed therein.

Alternatively, the color-forming composition may comprise an aggregate including thermochromic particles 140 suspended therein, as shown. The thermochromic composition may include at least one component that is present as particles 140 and another component that is dissolved in matrix material 150. For example, the thermochromic compound may comprise a leuco dye and activator, either of which may be provided as particles 140 or dissolved in matrix material 150. The activator and leuco dye, when mixed, produce a change in color that is discernable to the human eye. Either of the activator and the leuco dye may be soluble in the matrix. The other component (activator or leuco dye), or the single-component radiation-responsive composition, may be substantially insoluble in the matrix and may be suspended in the matrix as uniformly distributed particles 140.

The coloformers that can be used in practice of this invention include, but are not limited to, fluorans, phthalides, amino-triarylmethanes, aminoxanthenes, aminothioxanthenes, amino-9,10-dihydro-acridines, aminophenoxazines, aminophenothiazines, aminodihydro-phenazines, amino-diphenylmethanes, aminohydrocinnamic acids (cyanoethanes, leuco methines) and corresponding esters, 2(phydroxyphenyl)-4,5-diphenylimidazoles, indanones, leuco indamines, hydrozines, leuco indigoid dyes, amino-2,3-dihydroanthraquinones, tetrahalop, p'-biphenols, 2(p-hydroxyphenyl)-4,5-diphenylimidazoles, phenethylanilines, and mixtures thereof. According to one particular aspect of the present exemplary system and method, the leuco dye can be a fluoran, phthalide, aminotriarylmethane, or mixtures thereof. Several nonlimiting examples of suitable fluoran based leuco dyes include, but are not limited to, 3-diethylamino-6-methyl-7-anilinofluorane, 3-(N-ethyl-p-toluidino)-6-methyl-7-anilinofluorane, 3-(N-ethyl-N-isoamylamino)-6-methyl-7-anilinofluorane, 3-diethylamino-6-methyl-7-(o,p-dimethylanilino)fluorane, 3-pyrrolidino-6-methyl-7-anilinofluorane, 3-piperidino-6-methyl-7-anilinofluorane, 3-(N-cyclohexyl-Nmethylamino)-6-methyl-7-anilinofluorane, 3-diethylamino-7-(mtrifluoromethylanilino) fluorane, 3-dibutylamino-6-methyl-7-anilinofluorane, 3-diethylamino-6-chloro-7-anilinofluorane, 3-dibutylamino-7-(o-chloroanilino) fluorane, 3-diethylamino-7-(o-chloroanilino) fluorane, 3-di-n-pentylamino-6-methyl-7-anilinofluoran, 3-di-n-butylamino-6-methyl-7-anilinofluoran, 3-(n-ethyln-isopentylamino)-6-methyl-7-anilinofluoran, 3-pyrrolidino-6-methyl-7-anilinofluoran, 1(3H)-isobenzofuranone, 4,5,6,7-tetrachloro-3,3-bis[2-[4-(dimethylamino)phenyl]-2-(4-methoxyphenyl)ethenyl], and mixtures thereof.

Aminotriarylmethane leuco dyes can also be used in the present invention such as tris(N,N-dimethylaminophenyl) methane (LCV); tris(N,N-diethylaminophenyl) methane (LECV); tris (N,N-di-n-propylaminophenyl) methane (LPCV); tris(N,N-dinbutylaminophenyl) methane (LBCV); bis(4-diethylaminophenyl)-(4-diethylamino-2-methyl-phenyl) methane (LV-1); bis(4-diethylamino-2-methylphenyl)-(4-diethylamino-phenyl) methane (LV-2); tris(4-diethylamino-2-methylphenyl) methane (LV-3); bis(4-diethylamino-2-methylphenyl)(3,4-dimethoxyphenyl) methane (LB-8); aminotriarylmethane leuco dyes having different alkyl substituents bonded to the amino moieties wherein each alkyl group is independently selected from C1-C4 alkyl; and aminotriaryl methane leuco dyes with any of the preceding named structures that are further substituted with one or more alkyl groups on the aryl rings wherein the latter alkyl groups are independently selected from C1-C3 alkyl.

Additional leuco dyes can also be used in connection with the present exemplary systems and methods and are known to those skilled in the art. A more detailed discussion of appropriate leuco dyes may be found in U.S. Pat. Nos. 3,658,543 and 6,251,571, each of which are hereby incorporated by reference in their entireties. Additionally examples may be found in Chemistry and Applications of Leuco Dyes, Muthyala, Ramaiha, ed.; Plenum Press, New York, London; ISBN: 0-306-45459-9, incorporated herein by reference.

Further, according to one exemplary embodiment, a number of melting aids may be included with the above-mentioned leuco dyes. As used herein, the melting aids may include, but are in no way limited to, crystalline organic solids with melting temperatures in the range of approximately 50° C. to approximately 150° C., and preferably having melting temperature in the range of about 70° C. to about 120° C. In addition to aiding in the dissolution of the leuco-dye and the antenna dye, the above-mentioned melting aid may also assist in reducing the melting temperature of the leuco-dye and stabilize the leuco-dye alloy in the amorphous state, or slow down the re-crystallization of the leuco-dye alloy into individual components. Suitable melting aids include, but are in no way limited to, aromatic hydrocarbons (or their derivatives) that provide good solvent characteristics for leuco-dye and antenna dyes used in the present exemplary systems and methods. By way of example, suitable melting aids for use in the current exemplary systems and methods include, but are not limited to, m-terphenyl, pbenzyl biphenyl, alpha-naphtol benzylether, 1,2[bis(3,4]dimethylphenyl)ethane. In some embodiments, the percent of leuco dyes or other color-former and melting aid can be adjusted to minimize the melting temperature of the color-former phase without interfering with the development properties of the leuco dye. When used, the melting aid can comprise from approximately 2 wt % to approximately 25 wt % of the color-former phase.

According to one embodiment of the present exemplary system and method, the above-mentioned leuco-phase is uniformly dispersed/distributed in the matrix phase as a separate phase. In other words, at ambient temperature, the leuco phase is practically insoluble in matrix phase. Consequently, the leuco-dye and the acidic developer component of the matrix phase are contained in the separate phases and can not react with color formation at ambient temperature. However, upon heating with laser radiation, both phases melt and mix. Once mixed together, color is developed due to a reaction between the fluoran leuco dye and the acidic developer. According to one exemplary embodiment, when the leuco dye and the acidic developer melt and react, proton transfer from the developer opens a lactone ring of the leuco-dye, resulting in an extension of conjugate double bond system and color formation.

A number of acidic developers may be dispersed/dissolved in the present radiation curable polymer matrix. According to one exemplary embodiment, the acidic developers present in the radiation curable polymer matrix may include a phenolic species capable of developing color when reacting with a leuco dye and soluble or partially soluble in the coating matrix phase. Suitable developers for use with the present exemplary system and method include, but are in no way limited to, acidic phenolic compounds such as, for example, Bis-Phenol A, p-Hydroxy Benzyl Benzoate, Bisphenol S (4,4-Dihydroxydiphenyl Sulfone), 2,4-Dihydroxydiphenyl Sulfone, Bis(4-hydroxy-3-allylphenyl) sulfone (Trade name—TG-SA), 4-Hydroxyphenyl-4'-isopropoxyphenyl sulfone (Trade name—D8). The acidic developer may be either completely or at least partially dissolved in the UV-curable matrix.

If a single-component radiation-responsive composition is used, a human-readable mark can be produced by raising the temperature of the marking layer in the region where it is desired to form a mark sufficiently to cause the dye to change color; if a leuco dye is used in combination with an activator, a human-readable mark can be produced by raising the temperature of the marking layer in the region where it is desired to form a mark sufficiently to melt the matrix and provide a localized liquid phase in which the leuco dye and activator can react.

Matrix

The matrix material may be any composition suitable for dissolving and/or dispersing the thermochromic composition and forming a coating that is robust and durable. Acceptable materials may include, by way of example only, light-curable matrices such as acrylate derivatives, oligomers and monomers, including but not limited to urethane acrylates and polycarbonate acrylates. Particularly useful monomers are Trimethylolpropane triacrylate TMPTA SR531LV CAS 15625-89-5, polyester acrylates such as CN290 (available from Sartomer, Exton, Pa.), and Phthalic dicgycoldicarylate PDDA (available from Beijing Eastern Acrylic Chemical Technology Co., Ltd., China). The matrix material is combined with at least two cure methods as set out in detail below. In the case where photocuring occurs in both stages, the matrix material is combined with at least two photoinitiators in different bands of radiation as set out in detail below. In another variation, a polymer is heat cured using, for example, an amine-epoxy condensation, and then in the second cure step, cross linked using photoinitiation.

Matrix materials suitable for use in marking layer 130 may also be based on cationic polymerization resins and may require photo-initiators such as those based on aromatic diazonium salts, aromatic halonium salts, aromatic sulfonium salts and metallocene compounds. An example of an acceptable matrix or matrix may include Nor-Cote CLCDG-1250A or Nor-Cote CDG000 (mixtures of UV curable acrylate monomers and oligomers), which contains a photoinitiator (hydroxy ketone) and organic solvent acrylates (e.g., methyl methacrylate, hexyl methacrylate, beta-phenoxy ethyl acrylate, and hexamethylene acrylate). Other acceptable materials may include acrylated polyester oligomers such as CN292, CN293, CN294, SR351 (trimethylolpropane tri acrylate), SR395 (isodecyl acrylate), and SR256 (2(2-ethoxyethoxy) ethyl acrylate) available from Sartomer Co.

Photoinitiator

In some embodiments, the photoinitiators will include at least two light absorbing species that initiate curing reactions (polymerization) in the matrix. One of the photoinitiators may absorb light having UV wavelengths, while another may absorb light having the NIR or IR wavelengths.

One exemplary class of photoinitiators operable with UV light comprises benzophenone derivatives. Other examples of photoinitiators for free radical polymerization of monomers and pre-polymers include but are not limited to: thioxanethone derivatives, anthraquinone derivatives, acetophenones and benzoine ether types.

Photoinitiators selected to cause curing of the matrix at NIR wavelengths greater than 450 nm, or IR wavelengths greater than 750 nm, may include cyanine dye-borate complexes, such as described in Zhang et al., "*Studies on the near infrared laser induced photopolymerization employing a cyanine dye-borate complex as the photoinitiator,*" Polymer 42 (2001) 7575-7582. Commercially available IR photoinitiators include Dye S0455, CAS#5496-71-9, available from Few Chemicals, Wolfen, Germany, and Dye NK-3897, available from Hyashibara, Okayama, Japan.

Two-Stage Cure

According to certain embodiments of the invention, the photoinitiators are selected such that the matrix is cured in two stages. In some embodiments, the matrix is partially cured during manufacturing, i.e., prior to marking, and then further cured during marking. In these embodiments, the layer composition will include at least one photoinitiator that absorbs radiation at the marking wavelength(s). For example, the marking layer 130 may be applied as a paste, partially cured with UV light (first stage), and then marked with a laser that would simultaneously cause further curing (second stage). The marking laser could be a NIR or IR light source.

In other embodiments, the matrix is partially cured during manufacturing, i.e., prior to marking, and then fully cured after marking. In this case, the process is a three step process: 1) cure in manufacturing, 2) marking and 3) cure after marking. In these embodiments, one of the photoinitiators is selected such that the matrix can be cured at a wavelength that is different from the marking wavelength or by a form of radiation other than the type of radiation that causes a color change.

In still other embodiments, the first stage curing may be effected using a VIS, NIR, or IR light source at a low power setting, e.g., <5 W/cm$^2$, and the second stage cure could be effected using a similar or different light source at a higher power setting, e.g., >8 W/cm$^2$.

By providing a second stage of curing, a more robust and coating can be formed and archival stability is improved. The present concepts are particularly useful when complete curing at one wavelength is prevented by the presence of oxygen or inhibitors such as organic sulfides as chain termination agents. In addition, or alternatively, the principles described herein allow a shorter initial curing period, since the second stage can complete the cure. This in turn allows the belt speed to be increased during manufacturing, resulting in improved efficiency.

Antenna

In addition to the photo curing agents, imaging composition 130 may include an absorber or antenna so as to increase absorbance of the available light energy. In some embodiments, the absorber or antenna is tuned to the wavelength of the laser that will be used to create the desired marks using the color-forming agent that is included in the matrix. By effectively absorbing the available light, the absorber or antenna increases the heating effect of the laser, thereby enhancing the thermochromic response.

If present, the antenna may comprise any of a number of compositions that preferentially absorb light at a wavelength. The selected antenna may be dispersed or dissolved within the pigment particles, in the composition of the pigment particles 142 themselves, in the binder or carrier composition (liquid phase) if present, in the composition of substrate 120, or in color layer 150, if present. The content of the antenna in the imaging composition may be in the range of 0.05 to 50%, is preferably in the range of 0.1 to 10%, and more preferably in the range of 0.1 to 5%. In order to ensure that the imaging layer performs consistently and uniformly, it is preferred that the antenna be uniformly dissolved or dispersed in the imaging layer(s).

Without limitation, the antenna may be selected from the following compounds. For use with a 780 nm laser, preferred antenna dyes are:

(A) silicon 2,3 naphthalocyanine bis(trihexylsilyloxide) (Formula 1) (Aldrich 38,993-5, available from Aldrich, P.O. Box 2060, Milwaukee, Wis. 53201), and matrix soluble derivatives of 2,3 naphthalocyanine (Formula 2)

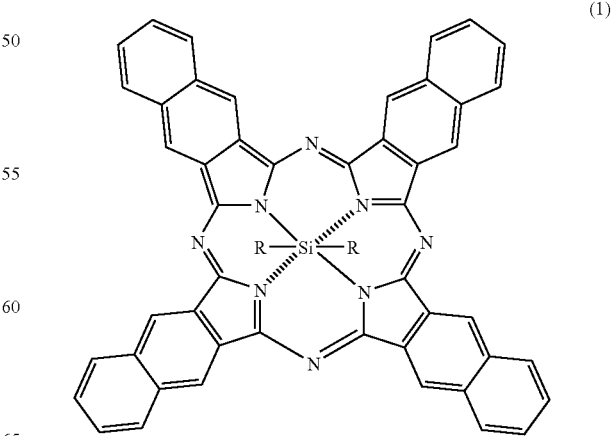

(1)

where $R = -O-Si-(CH_2(CH_2)_4CH_3)_3$;

(B) matrix soluble derivatives of silicon phthalocyanine, described in Rodgers, A. J. et al., 107 J. PHYS. CHEM. A 3503-3514 (May 8, 2003), and matrix soluble derivatives of benzophthalocyanines, described in Aoudia, Mohamed, 119 J. AM. CHEM. Soc. 6029-6039 (Jul. 2, 1997), (substructures illustrated by Formula 3 and Formula 4, respectively):

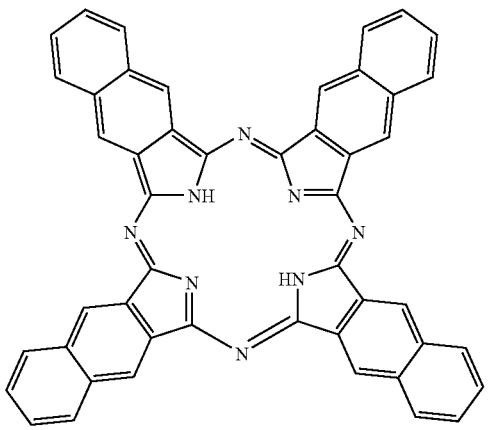

(2)

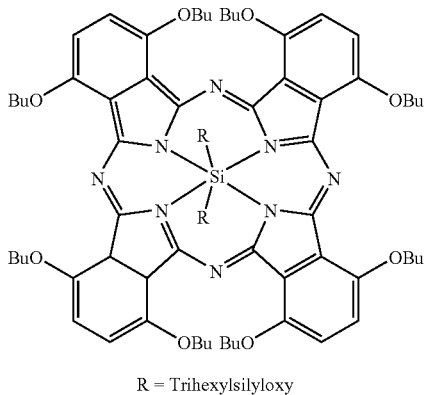

(3)

R = Trihexylsilyloxy

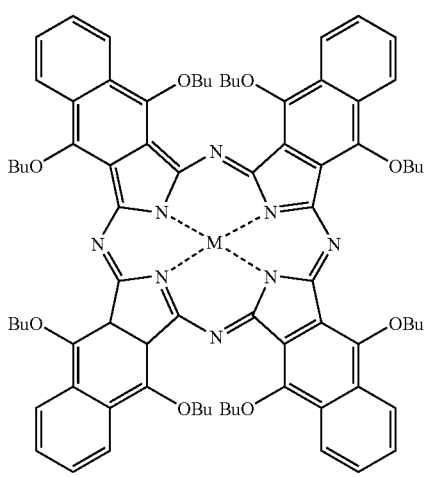

(4)

where M is a metal, and;

(C) compounds such as those shown in Formula 5 (as disclosed in U.S. Pat. No. 6,015,896)

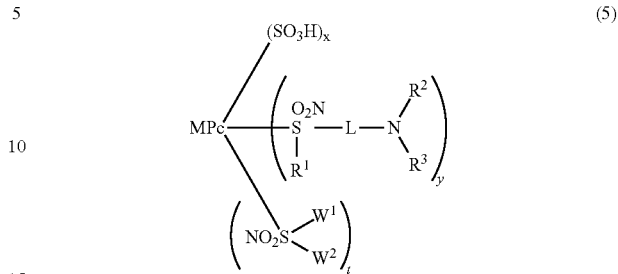

(5)

where M is a metal or hydrogen; Pc is a phthalocyanine nucleus; $R^1$, $R^2$, $W^1$, and $W^2$ are independently H or optionally substituted alkyl, aryl, or aralkyl; $R^3$ is an aminoalkyl group; L is a divalent organic linking group; x, y, and t are each independently 0.5 to 2.5; and (x+y+t) is from 3 to 4;

(D) compounds such as those shown in Formula 6 (as disclosed in U.S. Pat. No. 6,025,486)

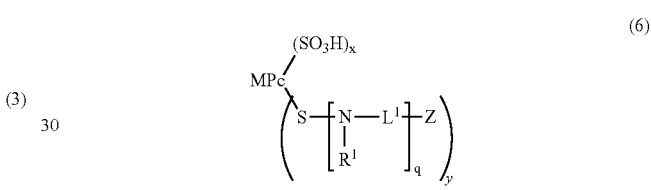

(6)

where M is a metal or hydrogen; Pc is a phthalocyanine nucleus; each $R^1$ independently is H or an optionally substituted alkyl, aryl, or aralkyl; $L^1$ independently is a divalent organic linking group; Z is an optionally substituted piperazinyl group; q is 1 or 2; x and y each independently have a value of 0.5 to 3.5; and (x+y) is from 2 to 5; or (E) 800NP (a proprietary dye available from Avecia, PO Box 42, Hexagon House, Blackley, Manchester M9 8ZS, England), a commercially available copper phthalocyanine derivative.

Additional examples of the suitable radiation antenna can be selected from a number of radiation absorbers such as, but not limited to, aluminum quinoline complexes, porphyrins, porphins, indocyanine dyes, phenoxazine derivatives, phthalocyanine dyes, polymethyl indolium dyes, polymethine dyes, guaiazulenyl dyes, croconium dyes, polymethine indolium dyes, metal complex IR dyes, cyanine dyes, squarylium dyes, chalcogeno-pyryloarylidene dyes, indolizine dyes, pyrylium dyes, quinoid dyes, quinone dyes, azo dyes, and mixtures or derivatives thereof. Other suitable antennas can also be used in the present system and method and are known to those skilled in the art and can be found in such references as *Infrared Absorbing Dyes*, Matsuoka, Masaru, ed., Plenum Press, New York, 1990 (ISBN 0-306434784) and *Near-Infrared Dyes for High Technology Applications*, Daehne, Resch-Genger, Wolfbeis, Kluwer Academic Publishers (ISBN 0-7923-5101-0), both of which are incorporated herein by reference.

Consideration can also be given to choosing the radiation antenna such that any light absorbed in the visible range does not adversely affect the graphic display or appearance of the color forming composition either before or after development. For example, in order to achieve a visible contrast between developed areas and non-imaged or non-developed areas of the coating, the color former can be chosen to form a color that is different than that of the background. For example, color formers having a developed color such as black, blue, red, magenta, and the like can provide a good contrast to a more yellow background. Optionally, an additional non-color former colorant can be added to the color forming compositions of the present system and method or the substrate on which the color forming composition is placed. Any known non-color former colorant can be used to achieve almost any desired background color for a given commercial product. Although the specific color formers and antennae discussed herein are typically separate compounds, such activity can also be provided by constituent groups of binders and/or color formers which are incorporated in the activation and/or radiation absorbing action of color former. These types of color former/radiation absorbers are also considered to be within the scope of the present system and method.

Various radiation antennas can act as an antenna to absorb electromagnetic radiation of specific wavelengths and ranges. Generally, a radiation antenna which has a maximum light absorption at or in the vicinity of the desired development wavelength can be suitable for use in the present system and method. For example, in one aspect of the present system and method, the color forming composition can be optimized within a range for development using infrared radiation having a wavelength from about 720 nm to about 900 nm in one embodiment.

Common CD-burning lasers have a wavelength of about 780 nm and can be adapted for forming images by selectively developing portions of the color forming composition. Radiation antennae which can be suitable for use in the infrared range can include, but are not limited to, polymethyl indoliums, metal complex IR dyes, indocyanine green, polymethine dyes such as pyrimidinetrione-cyclopentylidenes, guaiazulenyl dyes, croconium dyes, cyanine dyes, squarylium dyes, chalcogenopyryloarylidene dyes, metal thiolate complex dyes, bis(chalcogenopyrylo)polymethine dyes, oxyindolizine dyes, bis(aminoaryl)polymethine dyes, indolizine dyes, pyrylium dyes, quinoid dyes, quinone dyes, phthalocyanine dyes, naphthalocyanine dyes, azo dyes, hexafunctional polyester oligomers, heterocyclic compounds, and combinations thereof.

Several specific polymethyl indolium compounds which can be used are available from Aldrich Chemical Company, and include 2-[2-[2-chloro-3-[2-(1,3-dihydro-1,3,3-trimethyl-2H-indol-2-ylidene)-ethylidene]-1-cyclopenten-1-yl-ethenyl]-1,3,3-trimethyl-3H-indolium perchlorate; 2-[2-[2-Chloro-3-[2-(1,3-dihydro-1,3,3-trimethyl-2H-indol-2-ylidene)-ethylidene]-1-cyclopenten-1-yl-ethenyl]-1,3,3-trimethyl-3H-indolium chloride; 2-[2-[2-chloro-3-[(1,3-dihydro-3,3-dimethyl-1-propyl-2H-indol-2-ylidene)ethylidene]-1-cyclohexen-1-yl]ethenyl]-3,3-dimethyl-1-propylindolium iodide; 2-[2-[2-chloro-3-[(1,3-dihydro-1,3,3-trimethyl-2H-indol-2-ylidene)ethylidene]-1-cyclohexen-1-yl]ethenyl]-1,3,3-trimethylindolium iodide; 2-[2-[2-chloro-3-[(1,3-dihydro-1,3,3-trimethyl-2H-indol-2-ylidene)ethylidene]-1-cyclohexen-1-yl]ethenyl]-1,3,3-trimethylindolium perchlorate; 2-[2-[3-[(1,3-dihydro-3,3-dimethyl-1-propyl-2H-indol-2-ylidene)ethylidene]-2-(phenylthio)-1-cyclohexen-1-yl]ethenyl]-3,3-dimethyl-1-propylindolium perchlorate; and mixtures thereof. Alternatively, the radiation antenna can be an inorganic compound, e.g., ferric oxide, carbon black, selenium, or the like. Polymethine dyes or derivatives thereof such as a pyrimidinetrione-cyclopentylidene, squarylium dyes such as guaiazulenyl dyes, croconium dyes, or mixtures thereof can also be used in the present system and method. Suitable pyrimidinetrione-cyclopentylidene infrared antennae include, for example, 2,4,6(1H,3H,5H)-pyrimidinetrione 5-[2,5-bis[(1,3-dihydro-1,1,3-dimethyl-2H-indol-2-ylidene)ethylidene]cyclopentylidene]-1,3-dimethyl-(9Cl) (S0322 available from Few Chemicals, Germany).

Further, the radiation antenna can be selected for optimization of the color forming composition in a wavelength range from about 600 nm to about 720 nm, such as about 650 nm. Non-limiting examples of suitable radiation antennae for use in this range of wavelengths can include indocyanine dyes such as 3H-indolium,2-[5-(1,3-dihydro-3,3-dimethyl-1-propyl-2H-indol-2-ylidene)-1,3-pentadienyl]-3,3-dimethyl-1-propyl-,iodide) (Dye 724 λmax 642 nm), 3H-indolium, 1-butyl-2-[5-(1-butyl-1,3-dihydro-3,3-dimethyl-2H-indol-2-ylidene)-1,3-pentadienyl]-3,3-dimethyl-,perchlorate (Dye 683 λmax 642 nm), and phenoxazine derivatives such as phenoxazin-5-ium,3,7-bis(diethylamino)-,perchlorate (oxazine 1 λmax=645 nm). Phthalocyanine dyes having a λmax of about the desired development wavelength can also be used such as silicon 2,3-napthalocyanine bis(trihexylsilyloxide) and matrix soluble derivatives of 2,3-napthalocyanine (both commercially available from Aldrich Chemical); matrix soluble derivatives of silicon phthalocyanine (as described in Rodgers, A. J. et al., 107 J. Phys. Chem. A 3503-3514, May 8, 2003), and matrix soluble derivatives of benzophthalocyanines (as described in Aoudia, Mohamed, 119 J. Am. Chem. Soc. 6029-6039, Jul. 2, 1997); phthalocyanine compounds such as those described in U.S. Pat. Nos. 6,015,896 and 6,025,486, which are each incorporated herein by reference; and Cirrus 715 (a phthalocyanine dye available from Avecia, Manchester, England having a λmax=806 nm).

Laser light having blue and indigo wavelengths from about 300 nm to about 600 nm can be used to develop the color forming compositions. Therefore, color forming compositions may be selected for use in devices that emit wavelengths within this range. Recently developed commercial lasers found in certain DVD and laser disk recording equipment provide for energy at a wavelength of about 405 nm. Thus, the compositions discussed herein using appropriate radiation antennae can be suited for use with components that are already available on the market or are readily modified to accomplish imaging. Radiation antennae which can be useful for optimization in the blue (~405 nm) and indigo wavelengths can include, but are not limited to, aluminum quinoline complexes, porphyrins, porphins, and mixtures or derivatives thereof. Non-limiting specific examples of suitable radiation antenna can include 1-(2-chloro-5-sulfophenyl)-3-methyl-4-(4-sulfophenyl)azo-2-pyrazolin-5-one disodium salt (λ max=400 nm); ethyl 7-diethylaminocoumarin-3-carboxylate (λ max=418 nm); 3,3'-diethylthiacyanine ethylsulfate (λ max=424 nm); 3-allyl-5-(3-ethyl-4-methyl-2-thiazolinylidene) rhodanine (λ max=430 nm) (each available from Organica Feinchemie GmbH Wolfen), and mixtures thereof.

Non-limiting specific examples of suitable aluminum quinoline complexes can include tris(8-hydroxyquinolinato) aluminum (CAS 2085-33-8) and derivatives such as tris(5-cholor-8-hydroxyquinolinato)aluminum (CAS 4154-66-1), 2-(4-(1-methyl-ethyl)-phenyl)-6-phenyl-4H-thiopyran-4-ylidene)-propanedinitril-1,1-dioxide (CAS 174493-15-3), 4,4'-[1,4-phenylenebis(1,3,4-oxadiazole-5,2-diyl)]bis N,N-diphenyl benzeneamine (CAS 184101-38-0), bis-tetraethylammonium-bis(1,2-dicyano-dithiolto)-zinc(II) (CAS 21312-70-9), 2-(4,5-dihydronaphtho[1,2-d]-1,3-dithiol-2-ylidene)-4,5-dihydro-naphtho[1,2-d]1,3-dithiole, all available from Syntec GmbH.

Non-limiting examples of specific porphyrin and porphyrin derivatives can include etioporphyrin 1 (CAS 448-71-5), deuteroporphyrin IX 2,4 bis ethylene glycol (D630-9) available from Frontier Scientific, and octaethyl porphrin (CAS 2683-82-1), azo dyes such as Mordant Orange (CAS 2243-76-7), Merthyl Yellow (CAS 60-11-7), 4-phenylazoaniline (CAS 60-09-3), Alcian Yellow (CAS 61968-76-1), available from Aldrich chemical company, and mixtures thereof.

In each of these embodiments, generally, the radiation absorber can be present in the color forming composition as a whole at from about 0.1 wt % to about 5 wt %, and typically, from about 1 wt % to about 2 wt %, although other weight ranges may be desirable depending on the molar absorptivity of the particular radiation absorber.

Marking

During manufacturing, an optical recording medium with a partially cured coating on at least one of its surfaces is formed. As illustrated schematically, when it is desired to create a mark on the device, energy 110 may be directed imagewise onto imaging medium 100. The form of energy may vary depending upon the equipment available, ambient conditions, and desired result. Examples of energy that may be used include IR radiation, UV radiation, x-rays, or visible light. In some embodiments the light source is a laser.

Any laser or light source such as an LED can be used to provide energy to the color forming compositions; currently there are many such light sources are known. Those of particular interest include commercially available devices that can be incorporated into an optical disk reading and/or writing device, particularly those in the 200 nm to 1200 nm wavelength range. However, wavelengths outside of this range can also be used in alternative embodiments of the present invention. Exemplary laser types that can be used include krypton-fluoride excimer (249 nm), xenon-chloride eximer (308 nm), nitrogen gas (337 nm), organic dye in solution (300 nm to 1000 nm—tunable), krypton ion (335 nm to 800 nm), argon ion (450 nm to 530 nm), helium neon (543 nm, 632.8 nm, and 1150 nm), semiconductor GaInP family (670 nm to 680 nm), ruby (694 nm), semiconductor GaAlAs family (750 nm to 900 nm), neodymium YAG (1064 nm), semiconductor InGaAsP family (1300 nm to 1600 nm), hydrogen-fluoride chemical (2600 nm to 3000 nm), etc. In addition to the above, these and other commercially available lasers are available having wavelengths of: 375 nm, 405 nm, 408 nm, 440 nm, 635 nm, 638 nm, 650 nm, 660 nm, 670 nm, 685 nm, 780 nm, 785 nm, 810 nm, 830 nm, 850 nm, 980 nm, 1084 nm, 1310 nm, and 1550 nm, for example. These laser-types and others are useable in accordance with embodiments of the present invention, provided the light source is capable of providing sufficient energy to cause the desired color change.

At least some of the energy of the transmitted light is transformed into heat. Because the light is applied in a very localized fashion, the resulting heat is also localized. If sufficient light energy is applied to an area, the temperature of that area will rise enough to trigger a color change in the portion of marking layer 130. If the color-forming agent is a leuco dye and the change in temperature is sufficient to cause suspended particles 140 to melt, the activator and dye will react to form a color. At the same time, if the stage two photoinitiator in layer 130 is selected to operate at the wavelength of the marking beam, the marking process will cause further curing of the coating matrix in the marked area. It is also expected that it may be possible to effect further curing of the coating without creating a mark. This may carried out by applying a beam from the marking source of sufficiently low power or applying a full power beam for a sufficiently short period or sufficiently lower intensity to avoid causing a thermochromic response.

In certain embodiments, the machine-readable layers are applied to one surface of an optical recording medium and the present imaging compositions are applied to the opposite surface of the optical recording medium. For example, the layers may be applied to the surface(s) of optical media such as CDs or DVDs.

In these embodiments, the user can remove the disc or medium from the write drive after the first writing process, turn it over, and re-insert it in the write drive for the second writing process, or the write drive can be provided with two write heads, which address opposite sides of the medium. Alternatively, separate portions of one side of the optical recording medium can be designated for each of the machine- and human-readable images.

Thus, the present invention is applicable in systems comprising a processor, a laser coupled to the processor, and a data storage medium including a substrate having on at least one surface an imaging composition in accordance with the invention, comprising a matrix and a color-forming composition and at least two photoinitiators dispersed or dissolved in said matrix.

In still other embodiments, the imagable layers of the invention can be applied to packaging materials such as are used for food packaging.

The above discussion is meant to be illustrative of the principles and various embodiments of the present invention. Numerous variations and modifications will become apparent to those skilled in the art once the above disclosure is fully appreciated. For example, additional components, such as an addition absorber, flow or melt additives, or additional color-formers, may be added. It is intended that the following claims be interpreted to embrace all such variations and modifications. Likewise, the sequential recitation of steps in the claims that follow is not intended to require that the steps be performed sequentially or in the recited order, or that any step be completed before commencement of another step.

What is claimed is:

1. An, imaging medium comprising:
a substrate, and
an imaging composition disposed on said substrate, said imaging composition comprising:
a matrix;
a color-forming composition containing a color former and a developer dispersed or dissolved in said matrix; and
at least two photoinitiators dispersed or dissolved in said matrix, wherein at least one of said photoinitiators absorbs wavelengths shorter than 400 nm and at least one of said photoinitiators absorbs wavelengths greater than 450 nm.

2. The imaging medium of claim 1 wherein said color former comprises a leuco dye.

3. The imaging medium of claim 1 further including on said substrate a recording machine-readable mark formed using light at said predetermined wavelength.

4. The imaging medium of claim 1, wherein the photoinitiator that absorbs wavelengths shorter than 400 nm is selected from benzophenone derivatives.

5. The imaging medium of claim 1, wherein the photoinitiator that absorbs wavelengths shorter than 400 nm is selected from: thioxanethone derivatives, anthraquinone derivatives, acetophenones, or benzoine ether type photoinitiators.

6. The imaging medium of claim 1, wherein the photoinitiator that absorbs wavelengths greater than 750 nm is selected from cyanine dye-borate complexes.

7. The imaging medium of claim 1, wherein the imaging media is selected from a CD or DVD.

8. An, imaging medium comprising:
a substrate, and
an imaging composition disposed on said substrate, said imaging composition comprising:
   a matrix;
   a color-forming composition containing a color former and a developer dispersed or dissolved in said matrix; and
   at least two photoinitiators dispersed or dissolved in said matrix, wherein at least one of said photoinitiators absorbs wavelengths shorter than 450 nm and at least one of said photoinitiators absorbs wavelengths greater than 750 nm.

9. The imaging medium of claim 8, wherein the photoinitiator that absorbs wavelengths shorter than 400 nm is selected from benzophenone derivatives.

10. The imaging medium of claim 9, wherein the photoinitiator that absorbs wavelengths greater than 750 nm is selected from cyanine dye-borate complexes.

11. The imaging medium of claim 8, wherein the photoinitiator that absorbs wavelengths shorter than 400 nm is selected from: thioxanethone derivatives, anthraquinone derivatives, acetophenones, or benzoine ether type photoinitiators.

12. The imaging medium of claim 11, wherein the photoinitiator that absorbs wavelengths greater than 750 nm is selected from cyanine dye-borate complexes.

13. The imaging medium of claim 8, wherein the imaging media is selected from a CD or DVD.

* * * * *